(12) United States Patent
Suzuki et al.

(10) Patent No.: US 7,484,315 B2
(45) Date of Patent: Feb. 3, 2009

(54) REPLACEABLE PRECURSOR TRAY FOR USE IN A MULTI-TRAY SOLID PRECURSOR DELIVERY SYSTEM

(75) Inventors: Kenji Suzuki, Guilderland, NY (US);
Emmanuel P. Guidotti, Fishkill, NY (US); Gerrit J. Leusink, Saltpoint, NY (US); Masamichi Hara, Clifton Park, NY (US); Daisuke Kuroiwa, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 361 days.

(21) Appl. No.: 11/007,962

(22) Filed: Dec. 9, 2004

(65) Prior Publication Data

US 2006/0112883 A1    Jun. 1, 2006

Related U.S. Application Data

(63) Continuation-in-part of application No. 10/998,420, filed on Nov. 29, 2004.

(51) Int. Cl.
*F26B 25/10* (2006.01)

(52) U.S. Cl. ................ 34/237; 261/23.1; 118/726; 427/248.1

(58) Field of Classification Search ................ 34/237, 34/217, 218; 118/726; 427/248.1; 261/23.1
See application file for complete search history.

(56) References Cited

U.S. PATENT DOCUMENTS

| | | | |
|---|---|---|---|
| 3,801,294 A | 4/1974 | Schultz et al. | |
| 4,190,965 A | 3/1980 | Erickson | |
| 4,817,557 A | 4/1989 | Diem et al. | |
| 4,948,623 A | * 8/1990 | Beach et al. | 427/586 |
| 5,904,771 A | * 5/1999 | Tasaki et al. | 117/105 |

(Continued)

FOREIGN PATENT DOCUMENTS

JP    05-098445    4/1993

(Continued)

OTHER PUBLICATIONS

U.S. Patent and Trademark Office, Office Action in related U.S. Appl. No. 10/988,420, dated Apr. 5, 2007, 7 pp.

(Continued)

*Primary Examiner*—S. Gravini
(74) *Attorney, Agent, or Firm*—Wood, Herron & Evans, LLP

(57) ABSTRACT

A replaceable precursor tray for use with a high conductance, multi-tray solid precursor evaporation system coupled with a high conductance vapor delivery system is described for increasing deposition rate by increasing exposed surface area of solid precursor. The multi-tray solid precursor evaporation system is configured to be coupled to the process chamber of a thin film deposition system, and it includes a base tray with one or more stackable upper trays. Each tray is configured to support and retain film precursor in, for example, solid powder form or solid tablet form. Additionally, each tray is configured to provide for a high conductance flow of carrier gas over the film precursor while the film precursor is heated. For example, the carrier gas flows inward over the film precursor, and vertically upward through a flow channel within the stackable trays and through an outlet in the solid precursor evaporation system.

24 Claims, 5 Drawing Sheets

U.S. PATENT DOCUMENTS

| | | | |
|---|---|---|---|
| 5,914,001 A | 6/1999 | Hansen | 156/345 |
| 6,024,915 A | 2/2000 | Kume et al. | |
| 6,270,839 B1 * | 8/2001 | Onoe et al. | 427/248.1 |
| 6,380,080 B2 | 4/2002 | Visokay | |
| 6,544,345 B1 | 4/2003 | Mayer et al. | 134/28 |
| 6,897,160 B2 | 5/2005 | Derderian et al. | |
| 6,921,062 B2 | 7/2005 | Gregg et al. | |
| 2002/0013052 A1 | 1/2002 | Visokay | |
| 2002/0187632 A1 | 12/2002 | Marsh | |
| 2003/0053799 A1 | 3/2003 | Lei | |
| 2003/0203617 A1 | 10/2003 | Lane et al. | |
| 2004/0016404 A1 | 1/2004 | Gregg et al. | |
| 2004/0025370 A1 | 2/2004 | Guenther | |
| 2004/0161545 A1 | 8/2004 | Montano et al. | |
| 2004/0206935 A1 | 10/2004 | Miura et al. | |
| 2005/0006799 A1 | 1/2005 | Gregg et al. | |
| 2005/0072357 A1 | 4/2005 | Shero et al. | |
| 2006/0115589 A1 | 6/2006 | Vukoic | |
| 2006/0115590 A1 | 6/2006 | Suzuki et al. | |
| 2006/0220248 A1 | 10/2006 | Suzuki | |
| 2007/0072414 A1 | 3/2007 | Suzuki | |
| 2008/0081473 A1 | 4/2008 | Suzuki | |

FOREIGN PATENT DOCUMENTS

| | | |
|---|---|---|
| JP | 06306584 | 11/1997 |
| WO | WO 2004/010463 A2 | 1/2004 |
| WO | WO2004011695 A2 | 2/2004 |
| WO | 2006/058310 A1 | 6/2006 |

OTHER PUBLICATIONS

U.S. Patent and Trademark Office, Office Action in related U.S. Appl. No. 10/998,420, dated Sep. 26, 2007, 6 pp.

U.S. Patent and Trademark Office, Advisory Action in related U.S. Appl. No. 10/998,420, dated Dec. 6, 2007, 3 pp.

U.S. Patent and Trademark Office, Office Action in related U.S. Appl. No. 10/998,420, dated Mar. 13, 2008, 6 pp.

U.S. Patent and Trademark Office, Office Action in related U.S. Appl. No. 11/007,961, dated Mar. 6, 2008, 11 pp.

U.S. Patent and Trademark Office, Office Action in related U.S. Appl. No. 11/351,539, dated Sep. 11, 2007, 8 pp.

U.S. Patent and Trademark Office, Office Action in related U.S. Appl. No. 11/351,539, dated Apr. 5, 2007, 7 pp.

European Patent Office, International Search Report and Written Opinion, May 4, 2006, 7 pp.

EPO, International Search Report and Written Opinion of the International Searching Authority, International Application No. PCT/US2007/060561, Mailed May 9, 2007, 9 pp.

U.S. Patent and Trademark Office, Office Action in related U.S. Appl. No. 11/537,575, dated May 5, 2008, 10 pp.

U.S. Patent and Trademark Office, Office Action in related U.S. Appl. No. 11/096,077, dated Feb. 8, 2008, 8 pp.

U.S. Patent and Trademark Office, Office Action in related U.S. Appl. No. 11/096,077, dated Nov. 6, 2007, 3pp.

U.S. Patent and Trademark Office, Office Action in related U.S. Appl. No. 11/096,077, dated Aug. 24, 2007, 12 pp.

U.S. Patent and Trademark Office, Office Action in related U.S. Appl. No. 11/096,077, dated Dec. 29, 2006, 11 pp.

U.S. Patent and Trademark Office, Office Action in related U.S. Appl. No. 11/537,575, dated May 5, 2008, 10 pp.

U.S. Patent and Trademark Office, Office Action in related U.S. Appl. No. 11/096,077, dated Feb. 8, 2008, 8 pp.

U.S. Patent and Trademark Office, Office Action in related U.S. Appl. No. 11/096,077, dated Nov. 6, 2007, 3pp.

U.S. Patent and Trademark Office, Office Action in related U.S. Appl. No. 11/096,077, dated Aug. 24, 2007, 12 pp.

U.S. Patent and Trademark Office, Office Action in related U.S. Appl. No. 11/096,077, dated Dec. 29, 2006, 11 pp.

Taiwanese IPO, Notice of Examination Opinions in related TW Application No. 94143637, dated Mar. 25, 2008, 12 pp.

* cited by examiner

US 7,484,315 B2

REPLACEABLE PRECURSOR TRAY FOR USE IN A MULTI-TRAY SOLID PRECURSOR DELIVERY SYSTEM

CROSS-REFERENCE TO RELATED APPLICATIONS

This application is a Continuation-in-Part of co-pending U.S. patent application Ser. No. 10/998,420, entitled "Multi-Tray Film Precursor Evaporation System And Thin Film Deposition System Incorporating Same", filed on Nov. 29, 2004, the content of which is incorporated by reference herein in its entirety. This application is also related to co-pending U.S. patent application Ser. No. 11/007,961, entitled "Method For Preparing Solid Precursor Tray For Use In Solid Precursor Evaporation System", filed on even date herewith, the content of which is herein incorporated by reference in its entirety.

BACKGROUND OF THE INVENTION

1. Field of Invention

The present invention relates to a system for thin film deposition, and more particularly to a replaceable film precursor support assembly for use in the film precursor evaporation system of a thin film deposition system.

2. Description of Related Art

The introduction of copper (Cu) metal into multilayer metallization schemes for manufacturing integrated circuits can necessitate the use of diffusion barriers/liners to promote adhesion and growth of the Cu layers and to prevent diffusion of Cu into the dielectric materials. Barriers/liners that are deposited onto dielectric materials can include refractive materials, such as tungsten (W), molybdenum (Mo), and tantalum (Ta), that are non-reactive and immiscible in Cu, and can offer low electrical resistivity. Current integration schemes that integrate Cu metallization and dielectric materials can require barrier/liner deposition processes at substrate temperatures between about 400° C. and about 500° C., or lower.

For example, Cu integration schemes for technology nodes less than or equal to 130 nm currently utilize a low dielectric constant (low-k) inter-level dielectric, followed by a physical vapor deposition (PVD) TaN layer and Ta barrier layer, followed by a PVD Cu seed layer, and an electro-chemical deposition (ECD) Cu fill. Generally, Ta layers are chosen for their adhesion properties (i.e., their ability to adhere on low-k films), and Ta/TaN layers are generally chosen for their barrier properties (i.e., their ability to prevent Cu diffusion into the low-k film).

As described above, significant effort has been devoted to the study and implementation of thin transition metal layers as Cu diffusion barriers, these studies including such materials as chromium, tantalum, molybdenum and tungsten. Each of these materials exhibits low miscibility in Cu. More recently, other materials, such as ruthenium (Ru) and rhodium (Rh), have been identified as potential barrier layers since they are expected to behave similarly to conventional refractory metals. However, the use of Ru or Rh can permit the use of only one barrier layer, as opposed to two layers, such as Ta/TaN. This observation is due to the adhesive and barrier properties of these materials. For example, one Ru layer can replace the Ta/TaN barrier layer. Moreover, current research is finding that the one Ru layer can further replace the Cu seed layer, and bulk Cu fill can proceed directly following Ru deposition. This observation is due to good adhesion between the Cu and the Ru layers.

Conventionally, Ru layers can be formed by thermally decomposing a ruthenium-containing precursor, such as a ruthenium carbonyl precursor, in a thermal chemical vapor deposition (TCVD) process. Material properties of Ru layers that are deposited by thermal decomposition of metal-carbonyl precursors (e.g., $Ru_3(CO)_{12}$), can deteriorate when the substrate temperature is lowered to below about 400° C. As a result, an increase in the (electrical) resistivity of the Ru layers and poor surface morphology (e.g., the formation of nodules) at low deposition temperatures has been attributed to increased incorporation of CO reaction by-products into the thermally deposited Ru layers. Both effects can be explained by a reduced CO desorption rate from the thermal decomposition of the ruthenium-carbonyl precursor at substrate temperatures below about 400° C.

Additionally, the use of metal-carbonyls, such as ruthenium carbonyl, can lead to poor deposition rates due to their low vapor pressure, and the transport issues associated therewith. Overall, the inventor has observed that current deposition systems suffer from such a low rate, making the deposition of such metal films impractical.

SUMMARY OF THE INVENTION

The present invention provides a replaceable film precursor support assembly for use in a film precursor evaporation system of a thin film deposition system for increasing the deposition rate by increasing the exposed surface area of the film precursor. To this end, the precursor support assembly comprises a replaceable tray configured to support a film precursor, and configured to be stacked with one or more additional stackable trays in the film precursor evaporation system. The replaceable tray comprises a stackable outer wall and an inner wall configured to retain the film precursor therebetween, and one or more tray openings in the stackable outer wall configured to flow a carrier gas from a carrier gas supply system, over the film precursor and over the inner wall towards a center of the container to exhaust with film precursor vapor through an outlet in a lid of the film precursor evaporation system for delivery to the process chamber of the thin film deposition system.

DETAILED DESCRIPTION OF EMBODIMENTS OF THE INVENTION

In the following description, in order to facilitate a thorough understanding of the invention and for purposes of explanation and not limitation, specific details are set forth, such as a particular geometry of the deposition system and descriptions of various components. However, it should be understood that the invention may be practiced in other embodiments that depart from these specific details.

Figure 1:
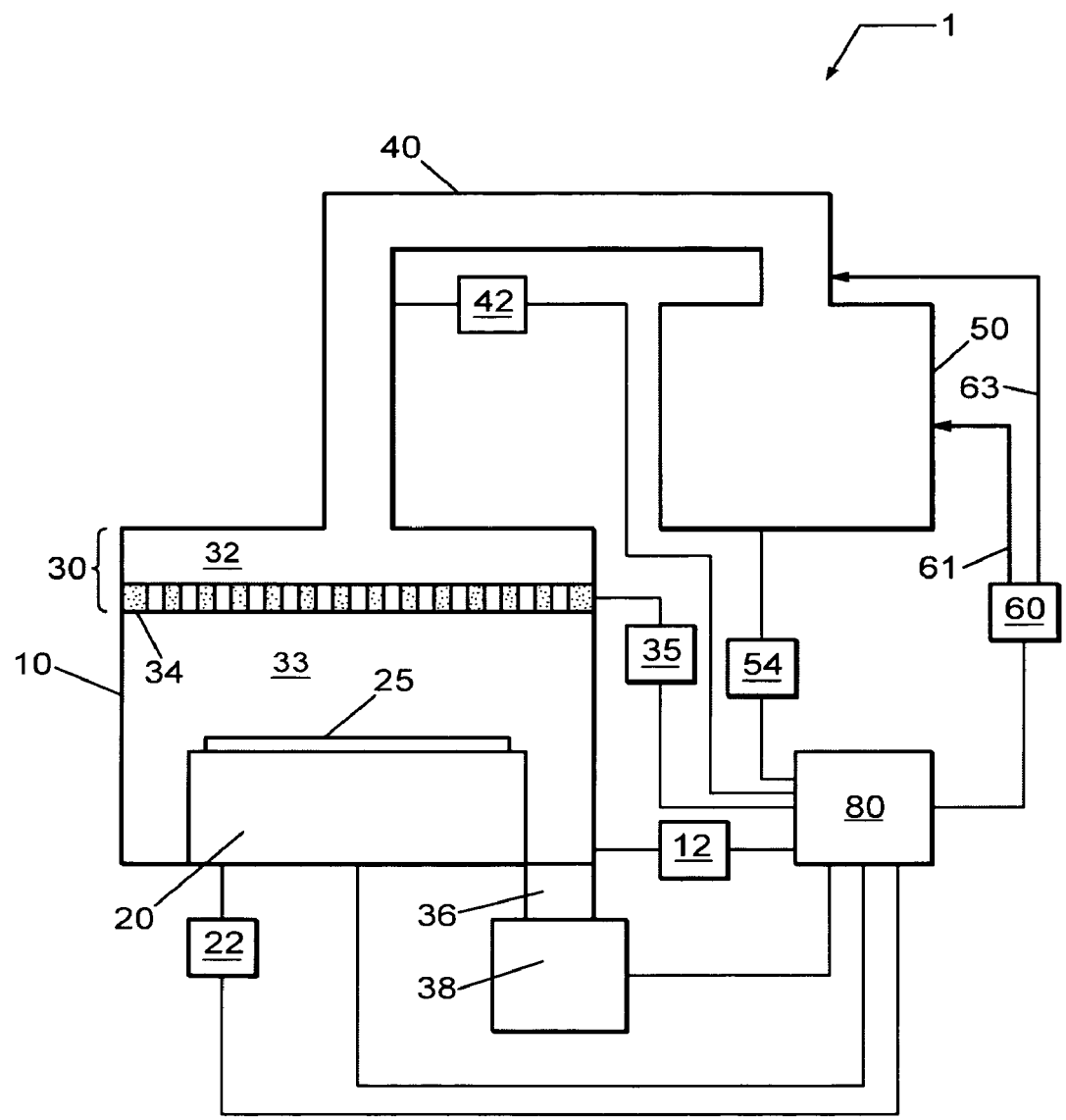
FIG. 1 depicts a schematic view of a deposition system according to an embodiment of the invention.

Referring now to the drawings, wherein like reference numerals designate identical or corresponding parts throughout the several views, FIG. 1 illustrates a deposition system 1 for depositing a thin film, such as a ruthenium (Ru) or a rhenium (Re) metal film, on a substrate according to one embodiment. The deposition system 1 comprises a process chamber 10 having a substrate holder 20 configured to support a substrate 25, upon which the thin film is formed. The process chamber 10 is coupled to a film precursor evaporation system 50 via a vapor precursor delivery system 40.

The process chamber 10 is further coupled to a vacuum pumping system 38 through a duct 36, wherein the pumping system 38 is configured to evacuate the process chamber 10, vapor precursor delivery system 40, and film precursor evaporation system 50 to a pressure suitable for forming the thin film on substrate 25, and suitable for evaporation of a film precursor (not shown) in the film precursor evaporation system 50.

Referring still to FIG. 1, the film precursor evaporation system 50 is configured to store a film precursor and heat the film precursor to a temperature sufficient for evaporating the film precursor, while introducing vapor phase film precursor to the vapor precursor delivery system 40. As will be discussed in more detail below with reference to FIGS. 3-6, the film precursor can, for example, comprise a solid film precursor. Additionally, for example, the film precursor can include a solid metal precursor. Additionally, for example, the film precursor can include a metal-carbonyl. For instance, the metal-carbonyl can include ruthenium carbonyl ($Ru_3(CO)_{12}$), or rhenium carbonyl ($Re_2(CO)_{10}$). Additionally, for instance, the metal-carbonyl can include $W(CO)_6$, $Mo(CO)_6$, $Co_2(CO)_8$, $Rh_4(CO)_{12}$, $Cr(CO)_6$, or $Os_3(CO)_{12}$.

In order to achieve the desired temperature for evaporating the film precursor (or subliming a solid metal precursor), the film precursor evaporation system 50 is coupled to an evaporation temperature control system 54 configured to control the evaporation temperature. For instance, the temperature of the film precursor is generally elevated to approximately 40 to 45° C. in conventional systems in order to sublime, for example, ruthenium carbonyl. At this temperature, the vapor pressure of the ruthenium carbonyl, for instance, ranges from approximately 1 to approximately 3 mTorr. As the film precursor is heated to cause evaporation (or sublimation), a carrier gas is passed over the film precursor or by the film precursor. The carrier gas can include, for example, an inert gas, such as a noble gas (i.e., He, Ne, Ar, Kr, Xe), or a monoxide, such as carbon monoxide (CO), for use with metal-carbonyls, or a mixture thereof. For example, a carrier gas supply system 60 is coupled to the film precursor evaporation system 50, and it is configured to, for instance, supply the carrier gas above the film precursor via feed line 61. In another example, carrier gas supply system 60 is coupled to the vapor precursor delivery system 40 and is configured to supply the carrier gas to the vapor of the film precursor via feed line 63 as or after it enters the vapor precursor delivery system 40. Although not shown, the carrier gas supply system 60 can comprise a gas source, one or more control valves, one or more filters, and a mass flow controller. For instance, the flow rate of carrier gas can range from approximately 5 sccm (standard cubic centimeters per minute) to approximately 1000 sccm. For example, the flow rate of carrier gas can range from about 10 sccm to about 200 sccm. By way of further example, the flow rate of carrier gas can range from about 20 sccm to about 100 sccm.

Downstream from the film precursor evaporation system 50, the film precursor vapor flows with the carrier gas through the vapor precursor delivery system 40 until it enters a vapor distribution system 30 coupled to the process chamber 10. The vapor precursor delivery system 40 can be coupled to a vapor line temperature control system 42 in order to control the vapor line temperature, and prevent decomposition of the film precursor vapor as well as condensation of the film precursor vapor. For example, the vapor line temperature can be set to a value approximately equal to or greater than the evaporation temperature. Additionally, for example, the vapor precursor delivery system 40 can be characterized by a high conductance in excess of about 50 liters/second.

Referring again to FIG. 1, the vapor distribution system 30, coupled to the process chamber 10, comprises a plenum 32 within which the vapor disperses prior to passing through a vapor distribution plate 34 and entering a processing zone 33 above substrate 25. In addition, the vapor distribution plate 34 can be coupled to a distribution plate temperature control system 35 configured to control the temperature of the vapor distribution plate 34. For example, the temperature of the vapor distribution plate can be set to a value approximately equal to the vapor line temperature. However, it may be less, or it may be greater.

Once film precursor vapor enters the processing zone 33, the film precursor vapor thermally decomposes upon adsorption at the substrate surface due to the elevated temperature of the substrate 25, and the thin film is formed on the substrate 25. The substrate holder 20 is configured to elevate the temperature of substrate 25, by virtue of the substrate holder 20 being coupled to a substrate temperature control system 22. For example, the substrate temperature control system 22 can be configured to elevate the temperature of substrate 25 up to approximately 500° C. In one embodiment, the substrate temperature can range from about 100° C. to about 500° C. In another embodiment, the substrate temperature can range from about 300° C. to about 400° C. Additionally, process chamber 10 can be coupled to a chamber temperature control system 12 configured to control the temperature of the chamber walls.

As described above, for example, conventional systems have contemplated operating the film precursor evaporation system 50, as well as the vapor precursor delivery system 40, within a temperature range of approximately 40 to 45° C. for ruthenium carbonyl in order to limit metal vapor precursor decomposition, and metal vapor precursor condensation. For example, ruthenium carbonyl precursor can decompose at elevated temperatures to form by-products, such as those illustrated below:

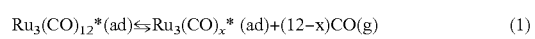

(1)

or,

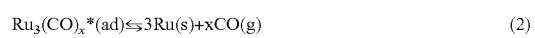

(2)

wherein these by-products can adsorb, i.e., condense, on the interior surfaces of the deposition system 1. The accumulation of material on these surfaces can cause problems from one substrate to the next, such as process repeatability. Alternatively, for example, ruthenium carbonyl precursor can condense at depressed temperatures to cause recrystallization, viz.

$$Ru_3(CO)_{12}(g) \leftrightarrows Ru_3(CO)_{12}*(ad) \qquad (3)$$

However, within such systems having a small process window, the deposition rate becomes extremely low, due in part to the low vapor pressure of ruthenium carbonyl. For instance, the deposition rate can be as low as approximately 1 Angstrom per minute. Therefore, according to one embodiment, the evaporation temperature is elevated to be greater than or equal to approximately 40° C. Alternatively, the evaporation temperature is elevated to be greater than or equal to approximately 50° C. In an exemplary embodiment of the present invention, the evaporation temperature is elevated to be greater than or equal to approximately 60° C. In a further exemplary embodiment, the evaporation temperature is elevated to range from approximately 60 to 100° C., and for example from approximately 60 to 90° C. The elevated temperature increases the evaporation rate due to the higher vapor pressure (e.g., nearly an order of magnitude larger) and, hence, it is expected by the inventors to increase the deposition rate. It may also be desirable to periodically clean deposition system 1 following processing of one or more substrates. For example, additional details on a cleaning method and system can be obtained from co-pending U.S. patent application Ser. No. 10/998,394, filed on Nov. 29, 2004 and entitled "Method and System for Performing In-situ Cleaning of a Deposition System", which is herein incorporated by reference in its entirety.

As discussed above, the deposition rate is proportional to the amount of film precursor that is evaporated and transported to the substrate prior to decomposition, or condensation, or both. Therefore, in order to achieve a desired deposition rate, and to maintain consistent processing performance (i.e., deposition rate, film thickness, film uniformity, film morphology, etc.) from one substrate to the next, it is important to provide the ability to monitor, adjust, or control the flow rate of the film precursor vapor. In conventional systems, an operator may indirectly determine the flow rate of film precursor vapor by using the evaporation temperature, and a pre-determined relationship between the evaporation temperature and the flow rate. However, processes and their performance drift in time, and hence it is imperative that the flow rate is measured more accurately. For example, additional details can be obtained from co-pending U.S. patent application Ser. No. 10/988,393, filed on even date herewith and entitled "Method and System for Measuring a Flow Rate in a Solid Precursor Delivery System", which is herein incorporated by reference in its entirety.

Still referring the FIG. 1, the deposition system 1 can further include a control system 80 configured to operate, and control the operation of the deposition system 1. The control system 80 is coupled to the process chamber 10, the substrate holder 20, the substrate temperature control system 22, the chamber temperature control system 12, the vapor distribution system 30, the vapor precursor delivery system 40, the film precursor evaporation system 50, and the carrier gas supply system 60.

Figure 2:
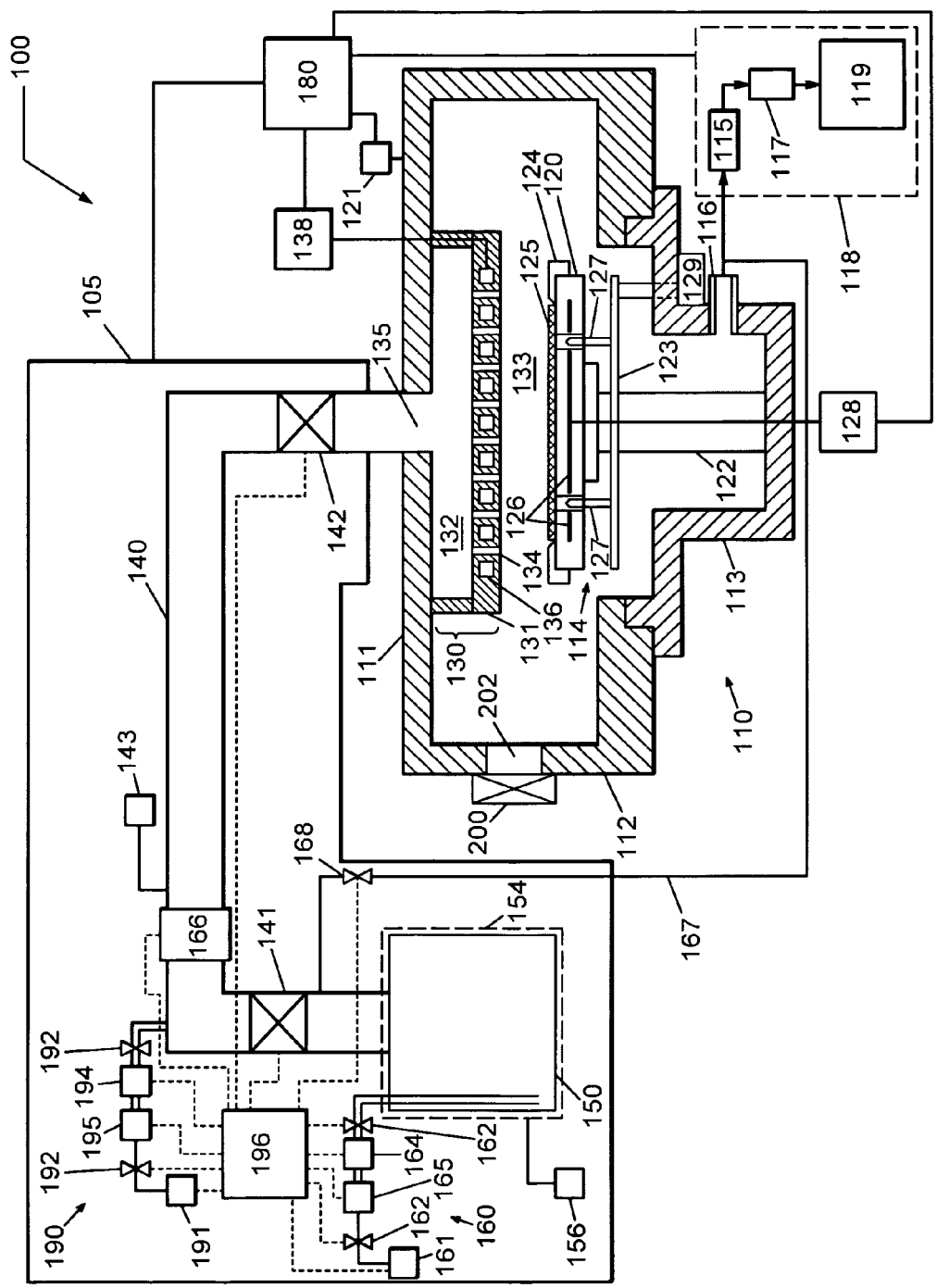
FIG. 2 depicts a schematic view of a deposition system according to another embodiment of the invention.

In yet another embodiment, FIG. 2 illustrates a deposition system 100 for depositing a thin film, such as a ruthenium (Ru) or a rhenium (Re) metal film, on a substrate. The deposition system 100 comprises a process chamber having a substrate holder 120 configured to support a substrate 125, upon which the thin film is formed. The process chamber 110 is coupled to a precursor delivery system 105 having film precursor evaporation system 150 configured to store and evaporate a film precursor (not shown), and a vapor precursor delivery system 140 configured to transport film precursor vapor.

The process chamber 110 comprises an upper chamber section 111, a lower chamber section 112, and an exhaust chamber 113. An opening 114 is formed within lower chamber section 112, where bottom section 112 couples with exhaust chamber 113.

Referring still to FIG. 2, substrate holder 120 provides a horizontal surface to support substrate (or wafer) 125, which is to be processed. The substrate holder 120 can be supported by a cylindrical support member 122, which extends upward from the lower portion of exhaust chamber 113. An optional guide ring 124 for positioning the substrate 125 on the substrate holder 120 is provided on the edge of substrate holder 120. Furthermore, the substrate holder 120 comprises a heater 126 coupled to substrate holder temperature control system 128. The heater 126 can, for example, include one or more resistive heating elements. Alternately, the heater 126 can, for example, include a radiant heating system, such as a tungsten-halogen lamp. The substrate holder temperature control system 128 can include a power source for providing power to the one or more heating elements, one or more temperature sensors for measuring the substrate temperature, or the substrate holder temperature, or both, and a controller configured to perform at least one of monitoring, adjusting, or controlling the temperature of the substrate or substrate holder.

During processing, the heated substrate 125 can thermally decompose the film precursor vapor, such as a metal-carbonyl precursor, and enable deposition of a thin film, such as a metal layer, on the substrate 125. According to one embodiment, the film precursor includes a solid precursor. According to another embodiment, the film precursor includes a metal precursor. According to another embodiment, the film precursor includes a solid metal precursor. According to yet another embodiment, the film precursor includes a metal-carbonyl precursor. According to yet another embodiment, the film precursor can be a ruthenium-carbonyl precursor, for example $Ru_3(CO)_{12}$. According to yet another embodiment of the invention, the film precursor can be a rhenium carbonyl precursor, for example $Re_2(CO)_{10}$. As will be appreciated by those skilled in the art of thermal chemical vapor deposition, other ruthenium carbonyl precursors and rhenium carbonyl precursors can be used without departing from the scope of the invention. In yet another embodiment, the film precursor can be $W(CO)_6$, $Mo(CO)_6$, $Co_2(CO)_8$, $Rh_4(CO)_{12}$, $Cr(CO)_6$, or $Os_3(CO)_{12}$. The substrate holder 120 is heated to a pre-determined temperature that is suitable for depositing, for instance, a desired Ru, Re, or other metal layer onto the substrate 125. Additionally, a heater (not shown), coupled to a chamber temperature control system 121, can be embedded in the walls of process chamber 110 to heat the chamber walls to a pre-determined temperature. The heater can maintain the temperature of the walls of process chamber 110 from about 40° C. to about 100° C., for example from about 40° C. to about 80° C. A pressure gauge (not shown) is used to measure the process chamber pressure.

Also shown in FIG. 2, a vapor distribution system 130 is coupled to the upper chamber section 111 of process chamber 110. Vapor distribution system 130 comprises a vapor distribution plate 131 configured to introduce precursor vapor from vapor distribution plenum 132 to a processing zone 133 above substrate 125 through one or more orifices 134.

Furthermore, an opening 135 is provided in the upper chamber section 111 for introducing a vapor precursor from vapor precursor delivery system 140 into vapor distribution plenum 132. Moreover, temperature control elements 136, such as concentric fluid channels configured to flow a cooled or heated fluid, are provided for controlling the temperature of the vapor distribution system 130, and thereby prevent the decomposition of the film precursor inside the vapor distribution system 130. For instance, a fluid, such as water, can be supplied to the fluid channels from a vapor distribution temperature control system 138. The vapor distribution temperature control system 138 can include a fluid source, a heat exchanger, one or more temperature sensors for measuring the fluid temperature or vapor distribution plate temperature or both, and a controller configured to control the temperature of the vapor distribution plate 131 from about 20° C. to about 100° C.

Film precursor evaporation system 150 is configured to hold a film precursor, and evaporate (or sublime) the film precursor by elevating the temperature of the film precursor. A precursor heater 154 is provided for heating the film precursor to maintain the film precursor at a temperature that produces a desired vapor pressure of film precursor. The precursor heater 154 is coupled to an evaporation temperature control system 156 configured to control the temperature of the film precursor. For example, the precursor heater 154 can be configured to adjust the temperature of the film precursor (or evaporation temperature) to be greater than or equal to approximately 40° C. Alternatively, the evaporation temperature is elevated to be greater than or equal to approximately 50° C. For example, the evaporation temperature is elevated to be greater than or equal to approximately 60° C. In one embodiment, the evaporation temperature is elevated to range from approximately 60 to 100° C., and in another embodiment, to range from approximately 60 to 90° C.

As the film precursor is heated to cause evaporation (or sublimation), a carrier gas can be passed over the film precursor, or by the film precursor. The carrier gas can include, for example, an inert gas, such as a noble gas (i.e., He, Ne, Ar, Kr, Xe), or a monoxide, such as carbon monoxide (CO), for use with metal-carbonyls, or a mixture thereof. For example, a carrier gas supply system 160 is coupled to the film precursor evaporation system 150, and it is configured to, for instance, supply the carrier gas above the film precursor. Although not shown in FIG. 2, carrier gas supply system 160 can also be coupled to the vapor precursor delivery system 140 to supply the carrier gas to the vapor of the film precursor as or after it enters the vapor precursor delivery system 140. The carrier gas supply system 160 can comprise a gas source 161, one or more control valves 162, one or more filters 164, and a mass flow controller 165. For instance, the flow rate of carrier gas can range from approximately 5 sccm (standard cubic centimeters per minute) to approximately 1000 sccm. In one embodiment, for instance, the flow rate of carrier gas can range from about 10 sccm to about 200 sccm. In another embodiment, for instance, the flow rate of carrier gas can range from about 20 sccm to about 100 sccm.

Additionally, a sensor 166 is provided for measuring the total gas flow from the film precursor evaporation system 150. The sensor 166 can, for example, comprise a mass flow controller, and the amount of film precursor delivered to the process chamber 110, can be determined using sensor 166 and mass flow controller 165. Alternately, the sensor 166 can comprise a light absorption sensor to measure the concentration of the film precursor in the gas flow to the process chamber 110.

A bypass line 167 can be located downstream from sensor 166, and it can connect the vapor delivery system 140 to an exhaust line 116. Bypass line 167 is provided for evacuating the vapor precursor delivery system 140, and for stabilizing the supply of the film precursor to the process chamber 110. In addition, a bypass valve 168, located downstream from the branching of the vapor precursor delivery system 140, is provided on bypass line 167.

Referring still to FIG. 2, the vapor precursor delivery system 140 comprises a high conductance vapor line having first and second valves 141 and 142 respectively. Additionally, the vapor precursor delivery system 140 can further comprise a vapor line temperature control system 143 configured to heat the vapor precursor delivery system 140 via heaters (not shown). The temperatures of the vapor lines can be controlled to avoid condensation of the film precursor in the vapor line. The temperature of the vapor lines can be controlled from about 20° C. to about 100° C., or from about 40° C. to about 90° C. For example, the vapor line temperature can be set to a value approximately equal to or greater than the evaporation temperature.

Moreover, dilution gases can be supplied from a dilution gas supply system 190. The dilution gas can include, for example, an inert gas, such as a noble gas (i.e., He, Ne, Ar, Kr, Xe), or a monoxide, such as carbon monoxide (CO), for use with metal-carbonyls, or a mixture thereof. For example, the dilution gas supply system 190 is coupled to the vapor precursor delivery system 140, and it is configured to, for instance, supply the dilution gas to vapor film precursor. The dilution gas supply system 190 can comprise a gas source 191, one or more control valves 192, one or more filters 194, and a mass flow controller 195. For instance, the flow rate of carrier gas can range from approximately 5 sccm (standard cubic centimeters per minute) to approximately 1000 sccm.

Mass flow controllers 165 and 195, and valves 162,192, 168, 141, and 142 are controlled by controller 196, which controls the supply, shutoff, and the flow of the carrier gas, the film precursor vapor, and the dilution gas. Sensor 166 is also connected to controller 196 and, based on output of the sensor 166, controller 196 can control the carrier gas flow through mass flow controller 165 to obtain the desired film precursor flow to the process chamber 110.

As illustrated in FIG. 2, the exhaust line 116 connects exhaust chamber 113 to pumping system 118. A vacuum pump 119 is used to evacuate process chamber 110 to the desired degree of vacuum, and to remove gaseous species from the process chamber 110 during processing. An automatic pressure controller (APC) 115 and a trap 117 can be used in series with the vacuum pump 119. The vacuum pump 119 can include a turbo-molecular pump (TMP) capable of a pumping seed up to 5000 liters per second (and greater). Alternately, the vacuum pump 119 can include a dry roughing pump. During processing, the carrier gas, dilution gas, or film precursor vapor, or any combination thereof, can be introduced into the process chamber 110, and the chamber pressure can be adjusted by the APC 115. For example, the chamber pressure can range from approximately 1 mTorr to approximately 500 mTorr, and in a further example, the chamber pressure can range from about 5 mTorr to 50 mTorr. The APC 115 can comprise a butterfly-type valve, or a gate valve. The trap 117 can collect unreacted precursor material, and by-products from the process chamber 110.

Referring back to the substrate holder 120 in the process chamber 110, as shown in FIG. 2, three substrate lift pins 127 (only two are shown) are provided for holding, raising, and lowering the substrate 125. The substrate lift pins 127 are coupled to plate 123, and can be lowered to below the upper surface of substrate holder 120. A drive mechanism 129 utilizing, for example, an air cylinder, provides means for raising and lowering the plate 123. Substrate 125 can be transferred into and out of process chamber 110 through gate valve 200, and chamber feed-through passage 202 via a robotic transfer system (not shown), and received by the substrate lift pins 127. Once the substrate 125 is received from the transfer system, it can be lowered to the upper surface of the substrate holder 120 by lowering the substrate lift pins 127.

Referring again to FIG. 2, a controller 180 includes a microprocessor, a memory, and a digital I/O port capable of generating control voltages sufficient to communicate and activate inputs of the processing system 100 as well as monitor outputs from the processing system 100. Moreover, the processing system controller 180 is coupled to and exchanges information with process chamber 110; precursor delivery system 105, which includes controller 196, vapor line temperature control system 142, and evaporation temperature control system 156; vapor distribution temperature control system 138; vacuum pumping system 118; and substrate holder temperature control system 128. In the vacuum pumping system 118, the controller 180 is coupled to and exchanges information with the automatic pressure controller 115 for controlling the pressure in the process chamber 110. A program stored in the memory is utilized to control the aforementioned components of deposition system 100 according to a stored process recipe. One example of processing system controller 180 is a DELL PRECISION WORKSTATION 610™, available from Dell Corporation, Dallas, Tex. The controller 180 may also be implemented as a general-purpose computer, digital signal process, etc.

Controller 180 may be locally located relative to the deposition system 100, or it may be remotely located relative to the deposition system 100 via an internet or intranet. Thus, controller 180 can exchange data with the deposition system 100 using at least one of a direct connection, an intranet, or the internet. Controller 180 may be coupled to an intranet at a customer site (i.e., a device maker, etc.), or coupled to an intranet at a vendor site (i.e., an equipment manufacturer). Furthermore, another computer (i.e., controller, server, etc.) can access controller 180 to exchange data via at least one of a direct connection, an intranet, or the internet.

Figure 3:
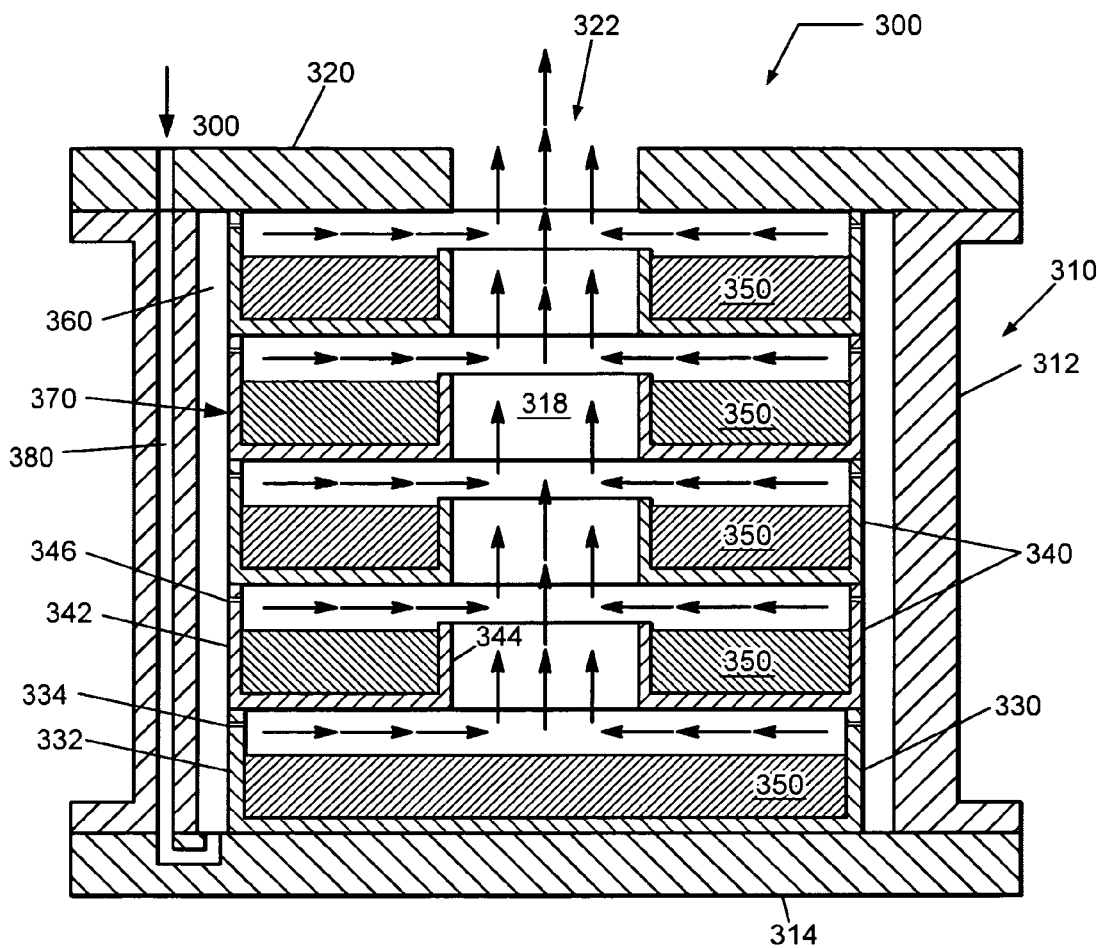
FIG. 3 presents in cross-sectional view a film precursor evaporation system according to an embodiment of the invention.

Referring now to FIG. 3, a film precursor evaporation system 300 is depicted in cross-sectional view according to an embodiment. The film precursor evaporation system 300 comprises a container 310 having an outer wall 312 and a bottom 314. Additionally, the film precursor evaporation system 300 comprises a lid 320 configured to be sealably coupled to the container 310, wherein the lid 320 includes an outlet 322 configured to be sealably coupled to the process chamber of a thin film deposition system, such as the one depicted in FIG. 1 or 2. The container 310 and lid 320 form a sealed environment when coupled to the thin film deposition system. The container 310 and lid 320 can, for example, be fabricated from A6061 aluminum, and may or may not include a coating applied thereon.

Furthermore, the container 310 is configured to be coupled to a heater (not shown) in order to elevate the evaporation temperature of the film precursor evaporation system 300, and to a temperature control system (not shown) in order to perform at least one of monitoring, adjusting, or controlling the evaporation temperature. When the evaporation temperature is elevated to an appropriate value as described earlier, film precursor evaporates (or sublimes) forming film precursor vapor to be transported through the vapor delivery system to the process chamber of the thin film deposition system. The container 310 is also sealably coupled to a carrier gas supply system (not shown), wherein container 310 is configured to receive a carrier gas for transporting the film precursor vapor.

Figure 4:
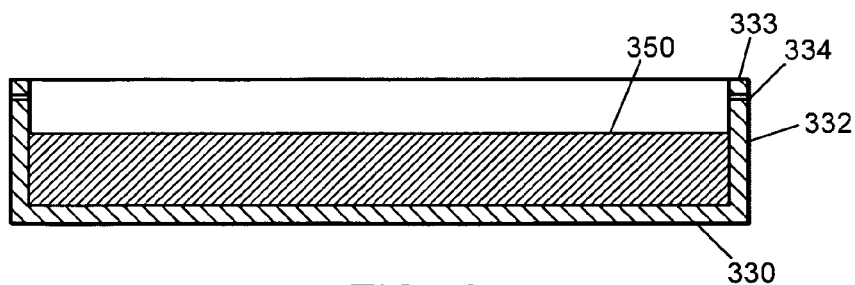
FIG. 4 presents in cross-sectional view a bottom tray for use in a film precursor evaporation system according to an embodiment of the invention.

Referring still to FIG. 3, and also to FIG. 4, the film precursor evaporation system 300 further comprises a base tray 330 configured to rest on the bottom 314 of the container 310, and having a base outer wall 332 configured to retain the film precursor 350 on the base tray 330. The base outer wall 332 includes a base support edge 333 for supporting upper trays thereon, as discussed below. Furthermore, the base outer wall 332 includes one or more base tray openings 334 configured to flow the carrier gas from the carrier gas supply system (not shown), over the film precursor 350 towards a center of the container 310, and along a central flow channel 318 to exhaust through the outlet 322 in the lid 320 with film precursor vapor. Consequently, the film precursor level in the base tray 330 should be below the position of the base tray openings 334.

Figure 5A:
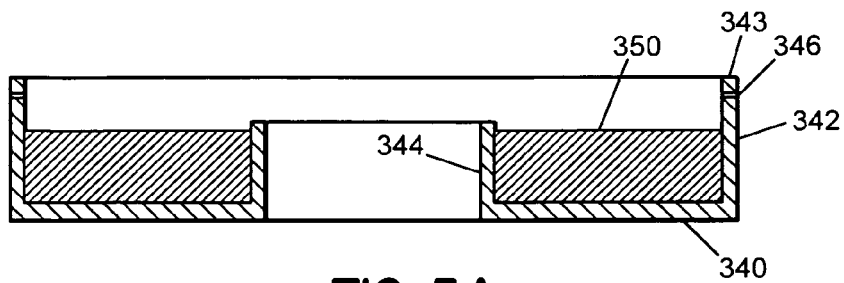
FIG. 5A presents in cross-sectional view a stackable upper tray for use in a film precursor evaporation system according to an embodiment of the invention.
Figure 5B:
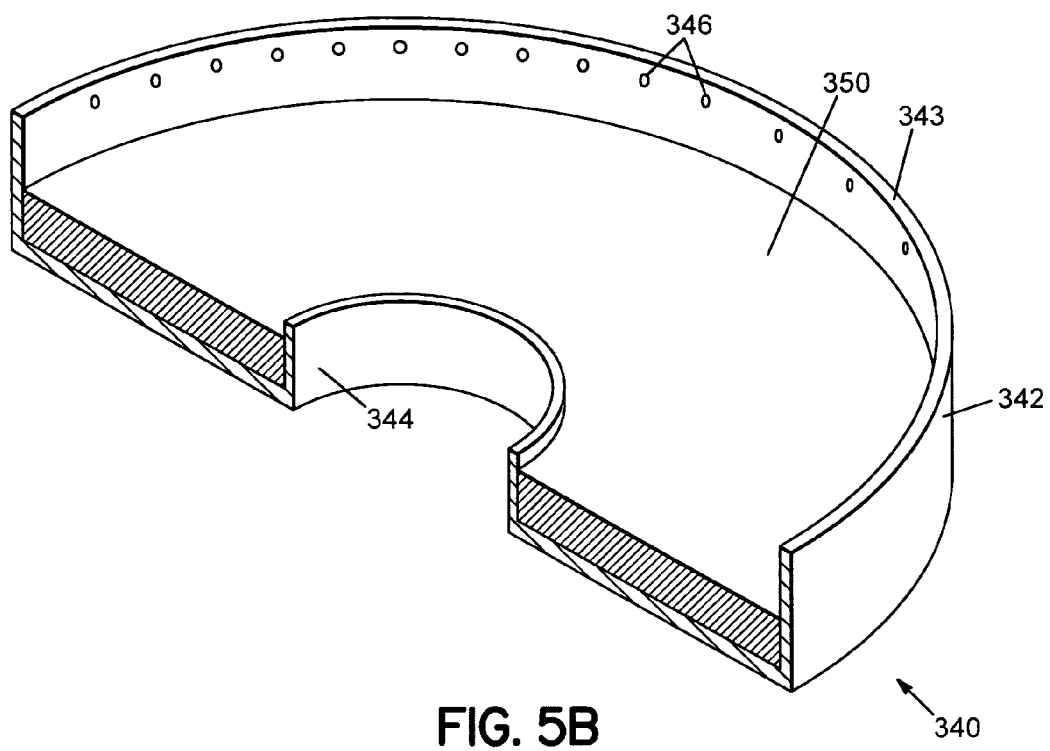
FIG. 5B presents in perspective view the tray of FIG. 5A.

Referring still to FIG. 3, and also to FIGS. 5A and 5B, the film precursor evaporation system 300 further comprises one or more stackable upper trays 340 configured to support the film precursor 350, and configured to be positioned or stacked upon at least one of the base tray 330 or another of the stackable upper trays 340. Each of the stackable upper trays 340 comprises an upper outer wall 342 and an inner wall 344 configured to retain the film precursor 350 therebetween. The inner walls 344 define the central flow channel 318. The upper outer wall 342 further includes an upper support edge 343 for supporting an additional upper tray 340. Thus, a first upper tray 340 is positioned to be supported on base support edge 333 of base tray 330, and if desired, one or more additional upper trays may be positioned to be supported on the upper support edge 343 of a preceding upper tray 340. The upper outer wall 342 of each upper tray 340 includes one or more upper tray openings 346 configured to flow the carrier gas from the carrier gas supply system (not shown), over the film precursor 350 towards central flow channel 318 of the container 310, and exhaust through the outlet 322 in the lid 320 with film precursor vapor. Consequently, inner walls 344 should be shorter than upper outer walls 342 to allow the carrier gas to flow substantially radially to the central flow channel 318. Additionally, the film precursor level in each upper tray 340 should be at or below the height of the inner walls 344, and below the position of the upper tray openings 346.

The base tray 330 and the stackable upper trays 340 are depicted to be cylindrical in shape. However, the shape can vary. For instance, the shape of the trays can be rectangular, square or oval. Similarly, the inner walls 344, and thus central upper flow channel 318, can be differently shaped.

When one or more stackable upper trays 340 are stacked upon the base tray 330, a stack 370 is formed, which provides for an annular space 360 between the base outer wall 332 of the base tray 330 and the container outer wall 312, and between the upper outer walls 342 of the one or more stackable upper trays 340 and the container outer wall 312. The container 310 can further comprise one or more spacers (not shown) configured to space the base outer wall 332 of the base tray 330 and the upper outer walls 342 of the one or more stackable upper trays 340 from the container outer wall 312, and thereby ensure equal spacing within the annular space 360. To state it another way, in one embodiment, the container 310 is configured such that the base outer wall 332 and the upper outer walls 342 are in vertical alignment.

Figure 6:
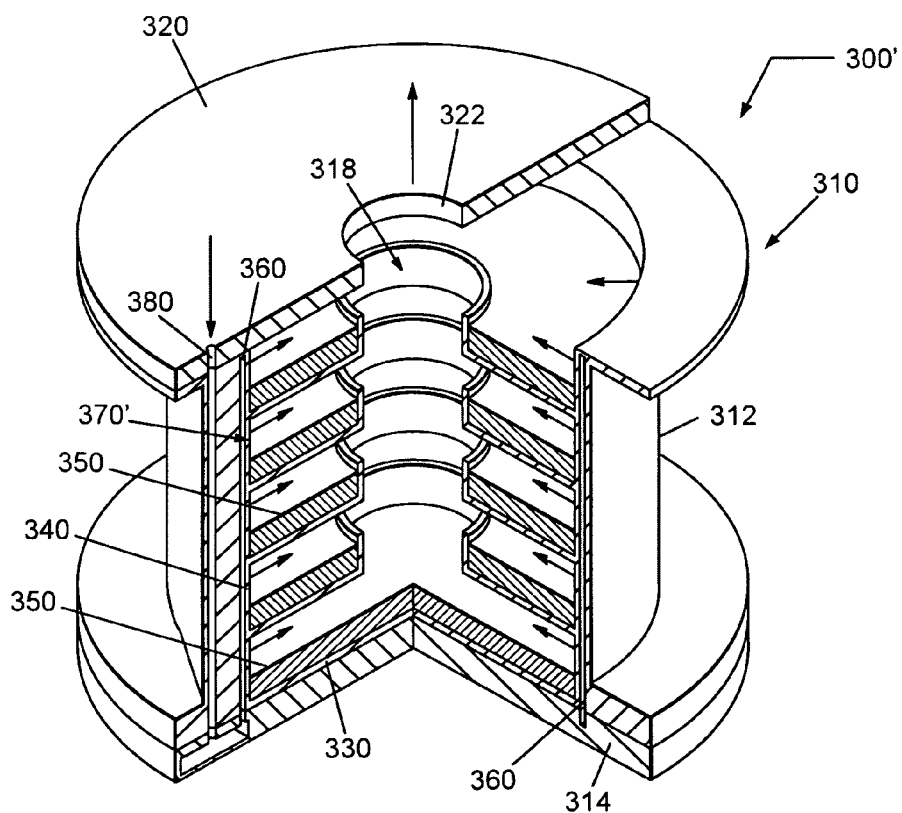
FIG. 6 presents in perspective view a film precursor evaporation system according to another embodiment of the invention.

The number of trays, including both the base tray and the stackable upper trays, can range from two (2) to twenty (20) and, for example in one embodiment, the number of trays can be five (5), as shown in FIG. 3. In an exemplary embodiment, the stack 370 includes a base tray 330 and at least one upper tray 340 supported by the base tray 330. The base tray 330 may be as shown in FIGS. 3 and 4, or may have the same configuration as the upper trays 340 as they are shown in FIGS. 3-5B. In other words, the base tray 330 may have an inner wall. Although, in FIGS. 3-5B, the stack 370 is shown to comprise a base tray 330 with one or more separatable and stackable upper trays 340, a system 300' may include a container 310' with a stack 370' that comprises a single unitary piece having a base tray 330 integral with one or more upper trays 340, as shown in FIG. 6, such that the base outer wall 332 and upper outer walls 342 are integral. Integral is understood to include a monolithic structure, such as an integrally molded structure having no discernible boundaries between trays, as well as a permanently adhesively or mechanically joined structure where there is permanent joinder between the trays. Separatable is understood to include no joinder between trays or temporary joinder, whether adhesive or mechanical.

The base tray 330 and each of the upper trays 340, whether stackable or integral, are configured to support a film precursor 350. According to one embodiment, the film precursor 350 includes a solid precursor. According to another embodiment, the film precursor 350 includes a liquid precursor. According to another embodiment, the film precursor 350 includes a metal precursor. According to another embodiment, the film precursor 350 includes a solid metal precursor. According to yet another embodiment, the film precursor 350 includes a metal-carbonyl precursor. According to yet another embodiment, the film precursor 350 can be a ruthenium-carbonyl precursor, for example $Ru_3(CO)_{12}$. According to yet another embodiment of the invention, the film precursor 350 can be a rhenium carbonyl precursor, for example $Re_2(CO)_{10}$. In yet another embodiment, the film precursor 350 can be $W(CO)_6$, $Mo(CO)_6$, $Co_2(CO)_8$, $Rh_4(CO)_{12}$, $Cr(CO)_6$, or $Os_3(CO)_{12}$.

As described above, the film precursor 350 can include a solid precursor. The solid precursor can take the form of a solid powder, or it may take the form of one or more solid tablets. For example, the one or more solid tablets can be prepared by a number of processes, including a sintering process, a stamping process, a dipping process, or a spin-on process, or any combination thereof. Additionally, the solid precursor in solid tablet form may or may not adhere to the base tray 330 or upper tray 340. For example, a refractory metal carbonyl powder may be sintered in a sintering furnace configured for one or both of vacuum and inert gas atmospheres, at a temperature up to 2000° C. and 2500° C. The sintering process may, for instance, include determining a softening point for the precursor powder, and operating at or near this softening point during the sintering process. Alternatively, for example, a refractory metal carbonyl powder can be dispersed in a fluid medium, such as a solvent, dispensed on a coating substrate, such as a tray, and distributed evenly over the surface of the coating substrate using a spin coating process. The spin coat may then be baked to evaporate residual solvent. Alternatively, for example, a refractory metal carbonyl powder can be dispersed in a bath of fluid, such as a solvent, and a coating substrate may be dipped into the bath. The coating substrate can include a solid plate, a rod, or a porous plate, such as a mesh. Thereafter, the coating substrate may be baked in order to evaporate residual solvent. The coating substrate may be the base tray 330 and/or an upper tray 340, or alternatively, may be a separate substrate that is place in the base tray 330 and/or an upper tray 340 after preparing the solid precursor thereon.

As described earlier, carrier gas is supplied to the container 310 from a carrier gas supply system (not shown). As shown in FIGS. 3 and 6, the carrier gas may be coupled to the container 310 through the lid 320 via a gas supply line (not shown) sealably coupled to the lid 320. The gas supply line feeds a gas channel 380 that extends downward through the outer wall 312 of container 310, passes through the bottom 314 of container 310 and opens to the annular space 360.

Referring again to FIG. 3, the inner diameter of the container outer wall 312 can, for example, range from approximately 10 cm to approximately 100 cm and, for example, can range from approximately 15 cm to approximately 40 cm. For instance, the inner diameter of outer wall 312 can be 20 cm. The diameter of the outlet 322 and the inner diameter of the inner walls 344 of the upper trays 340 can, for example, range from approximately 1 cm to 30 cm and, additionally, for example, the outlet diameter and inner wall diameter can range from approximately 5 to approximately 20 cm. For instance, the outlet diameter can be 10 cm. Additionally, the outer diameter of the base tray 330 and each of the upper trays 340 can range from approximately 75% to approximately 99% of the inner diameter of the outer wall 312 of container 310 and, for example, the tray diameter can range from approximately 85% to 99% of the inner diameter of the outer wall 312 of container 310. For instance, the tray diameter can be 19.75 cm. Additionally, the height of the base outer wall 332 of base tray 330 and of the upper outer wall 342 of each of the upper trays 340 can range from approximately 5 mm to approximately 50 mm and, for example, the height of each is approximately 30 mm. In addition, the height of each inner wall 344 can range from approximately 10% to approximately 90% of the height of the upper outer wall 342. For example, the height of each inner wall can range from approximately 2 mm to approximately 45 mm and, for example, is approximately 20 mm.

Referring yet again to FIG. 3, the one or more base tray openings 334 and the one or more upper tray openings 346 can include one or more slots. Alternatively, the one or more base tray openings 334 and the one or more upper tray openings 346 can include one or more circular orifices. The diameter of each orifice can, for example, range from approximately 0.4 mm to approximately 2 mm. For example, the diameter of each orifice can be approximately 1 mm. In one embodiment, the orifice diameter and width of annular space 360 are chosen such that the conductance through annular space 360 is sufficiently larger than the net conductance of the orifices in order to maintain substantially uniform distribution of the carrier gas throughout the annular space 360. The number of orifices can, for example, range from approximately 2 to approximately 1000 orifices and, by way of further example, can range from approximately 50 to approximately 100 orifices. For instance, the one or more base tray openings 334 can include seventy two (72), orifices of 1 mm diameter, and the one or more stackable tray openings 346 can include seventy two (72) orifices of 1 mm diameter, wherein the width of the annular space 360 is approximately 2.65 mm.

The film precursor evaporation system 300 or 300' may be used as either film precursor evaporation system 50 in FIG. 1, or film precursor evaporation system 150 in FIG. 2. Alternatively, system 300 or 300' may be used in any film deposition system suitable for depositing a thin film on a substrate from precursor vapor.

Figure 7:
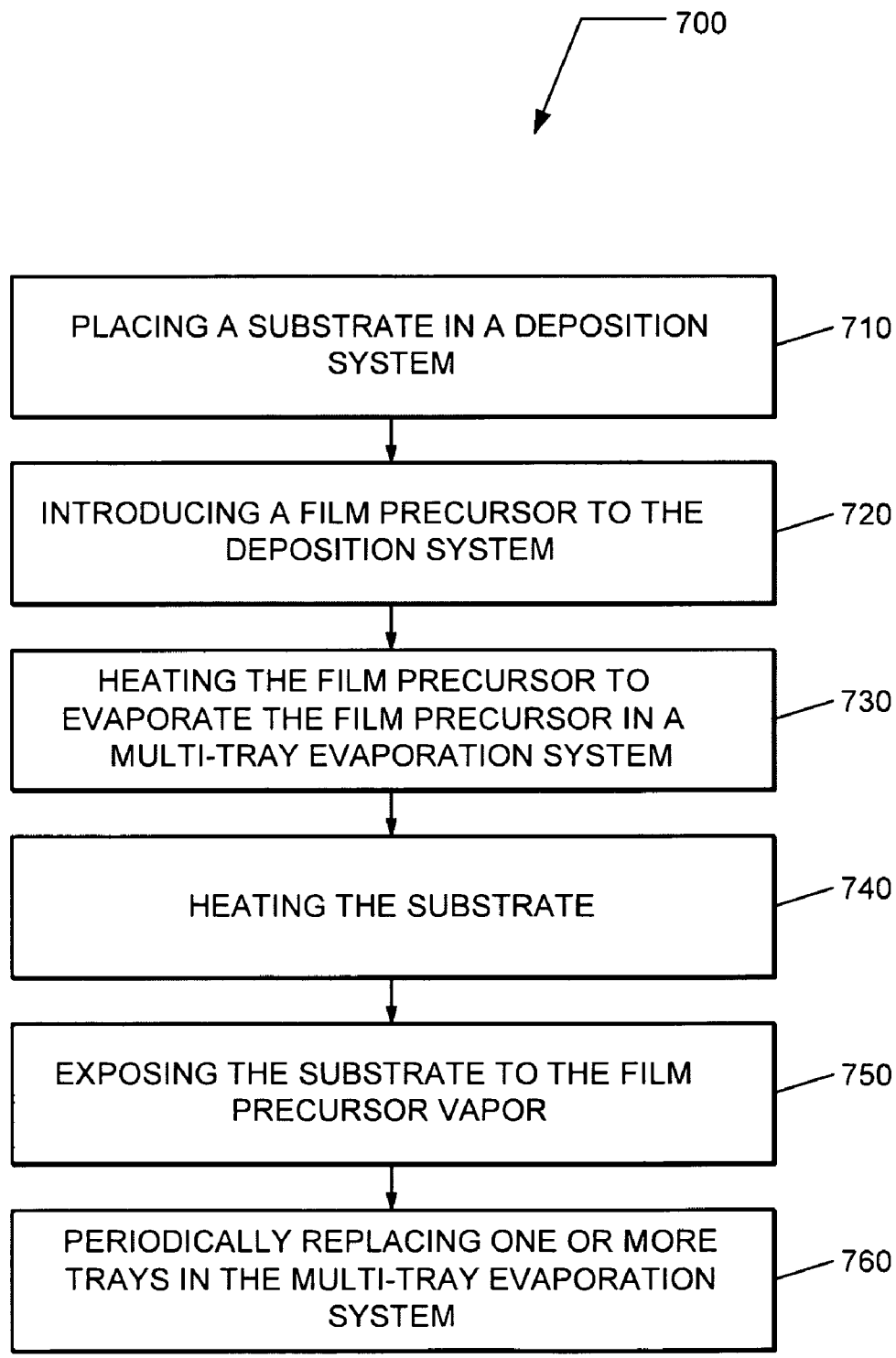
FIG. 7 illustrates a method of operating a film precursor evaporation system of the invention.

Referring now to FIG. 7, a method of depositing a thin film on a substrate is described. A flow chart 700 is used to illustrate the steps in depositing the thin film in a deposition system of the present invention. The thin film deposition begins in 710 with placing a substrate in the deposition system in succession for forming the thin film on the substrate. For example, the deposition system can include any one of the depositions systems described above in FIGS. 1 and 2. The deposition system can include a process chamber for facilitating the deposition process, and a substrate holder coupled to the process chamber and configured to support the substrate. Then, in 720, a film precursor is introduced to the deposition system. For instance, the film precursor is introduced to a film precursor evaporation system coupled to the process chamber via a precursor vapor delivery system. Additionally, for instance, the precursor vapor delivery system can be heated.

In 730, the film precursor is heated to form a film precursor vapor. The film precursor vapor can then be transported to the process chamber through the precursor vapor delivery system. In 740, the substrate is heated to a substrate temperature sufficient to decompose the film precursor vapor, and, in 750, the substrate is exposed to the film precursor vapor. Steps 710 to 750 may be repeated successively a desired number of times to deposit a metal film on a desired number of substrates.

Following the deposition of the thin film on one or more substrates, the stack of trays 370 or 370', or one or more of the base or upper trays 330, 340, can be periodically replaced in 760 in order to replenish the level of film precursor 350 in each tray.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A replaceable film precursor support assembly for use in a film precursor evaporation system comprising a container having an outer container wall and a bottom, and a lid configured to be sealably coupled to said container, said lid comprising an outlet configured to be sealably coupled to a process chamber configured to deposit a thin film on a substrate, the assembly comprising:
    a replaceable tray supporting a film precursor, and configured to be stacked with one or more additional stackable trays in said film precursor evaporation system,
    wherein said replaceable tray comprises a bottom support surface defined between an outer edge and an inner edge, a stackable outer wall extending upwardly from said outer edge and terminating in an upper support edge for supporting said one or more additional stackable trays, and an inner wall shorter than said stackable outer wall and extending upwardly from said inner edge of said bottom support surface, said film precursor between said stackable outer wall and said inner wall on said bottom support surface, wherein said inner wall defines a central flow channel in said container and said stackable outer wall, said bottom support surface, and said inner wall define a tray space, and said replaceable tray includes one or more tray openings in said stackable outer wall configured to flow a carrier gas from a carrier gas supply system, through said one or more tray openings and from said stackable outer wall over said film precursor and over said inner wall towards said central flow channel and upward through said central flow channel to exhaust through said outlet in said lid with film precursor vapor.

2. The replaceable film precursor support assembly of claim 1, wherein said replaceable tray supports a metal precursor.

3. The replaceable film precursor support assembly of claim 1, wherein said replaceable tray supports a solid precursor.

4. The replaceable film precursor support assembly of claim 3, wherein said solid precursor comprises a solid powder form.

5. The replaceable film precursor support assembly of claim 3, wherein said solid precursor comprises a solid tablet form.

6. The replaceable film precursor support assembly of claim 1, wherein said replaceable tray supports a metal-carbonyl film precursor.

7. The replaceable film precursor support assembly of claim 6, wherein said metal-carbonyl film precursor includes $W(CO)_6$, $Mo(CO)_6$, $Co_2(CO)_8$, $Rh_4(CO)_{12}$, $Re_2(CO)_{10}$, $Cr(CO)_6$, $Ru_3(CO)_{12}$, or $Os_3(CO)_{12}$.

8. The replaceable film precursor support assembly of claim 1, wherein said replaceable tray is cylindrical in shape, having an inner diameter at said inner wall and an outer diameter at said stackable outer wall.

9. The replaceable film precursor support assembly of claim 8, wherein the outer diameter at said stackable outer wall ranges from about 75% to about 99% of an inner diameter of said outer container wall.

10. The replaceable film precursor support assembly of claim 8, wherein the outer diameter of said stackable outer wall ranges from about 85% to about 99% of an inner diameter of said outer container wall.

11. The replaceable film precursor support assembly of claim 8, wherein the inner diameter at said inner wall ranges from approximately 1 cm to approximately 30 cm.

12. The replaceable film precursor support assembly of claim 8, wherein the inner diameter at said inner wall ranges from approximately 5 cm to approximately 20 cm.

13. The replaceable film precursor support assembly of claim 1, wherein said one or more tray openings include one or more slots.

14. The replaceable film precursor support assembly of claim 1, wherein said one or more tray openings includes one or more circular orifices.

15. The replaceable film precursor support assembly of claim 14, wherein the diameter of each of said one or more circular orifices ranges from approximately 0.4 to approximately 1 mm.

16. The replaceable film precursor support assembly of claim 14, wherein the number of said one or more circular orifices ranges from 2 to 1000 orifices.

17. The replaceable film precursor support assembly of claim 14, wherein the number of said one or more circular orifices ranges from 50 to 100 orifices.

18. The replaceable film precursor support assembly of claim 1, wherein the height of said stackable outer wall of said replaceable tray ranges from approximately 5 mm to approximately 50 mm.

19. The replaceable film precursor support assembly of claim 18, wherein the height of said inner wall of said replaceable tray is less than the height of said stackable outer wall.

20. The replaceable film precursor support assembly of claim 19, wherein the height of said inner wall ranges from approximately 10% to approximately 90% of the height of the stackable outer wall.

21. The replaceable film precursor support assembly of claim 1, wherein said replaceable tray supports a film precursor, and wherein the depth of said film precursor in said replaceable tray ranges up to approximately 40 mm, and is less than the height of said inner wall.

22. The replaceable film precursor support assembly of claim 21, wherein the depth of said film precursor in said replaceable tray ranges up to approximately 15 mm.

23. A replaceable film precursor support assembly for use in a film precursor evaporation system comprising a container having an outer container wall and a bottom, and a lid configured to be sealably coupled to said container, said lid comprising an outlet configured to be sealably coupled to a process chamber configured to deposit a thin film on a substrate, the assembly comprising:

a replaceable tray supporting a film precursor, said replaceable tray being configured to heat to an evaporation temperature by heat conducted through said container to evaporate said film precursor, and configured to be stacked with one or more additional stackable trays in said film precursor evaporation system, wherein said replaceable tray comprises a bottom support surface defined between an outer edge and an inner edge, a stackable outer wall extending upwardly from said outer edge and terminating in an upper support edge for supporting said one or more additional stackable trays, and an inner wall shorter than said stackable outer wall and extending upwardly from said inner edge of said bottom support surface, said film precursor positioned between said stackable outer wall and said inner wall on said bottom support surface wherein said inner wall defines a central flow channel in said container and said stackable outer wall, said bottom support surface, and said inner wall define a tray space, and said replaceable tray includes one or more tray openings in said stackable outer wall configured to flow a carrier gas from a carrier gas supply system, through said one or more tray openings and from said stackable outer wall over said film precursor and over said inner wall towards said central flow channel and upward through said central flow channel to exhaust through said outlet in said lid with film precursor vapor.

24. The replaceable film precursor support assembly of claim 23 further including:

an evaporation temperature control system in thermal communication with said replaceable tray and configured to control a temperature of said replaceable tray and to regulate a supply of heat to said replaceable tray for controlling said temperature of said replaceable tray at said evaporation temperature.

* * * * *